(12) United States Patent
Arakawa

(10) Patent No.: US 10,497,854 B2
(45) Date of Patent: Dec. 3, 2019

(54) PIEZOELECTRIC ACTUATOR, STACKED ACTUATOR, PIEZOELECTRIC MOTOR, ROBOT, HAND, AND LIQUID TRANSPORT PUMP

(71) Applicant: Seiko Epson Corporation, Tokyo (JP)

(72) Inventor: Yutaka Arakawa, Hara (JP)

(73) Assignee: Seiko Epson Corporation (JP)

( * ) Notice: Subject to any disclaimer, the term of this patent is extended or adjusted under 35 U.S.C. 154(b) by 495 days.

(21) Appl. No.: 15/349,202

(22) Filed: Nov. 11, 2016

(65) Prior Publication Data

US 2017/0141290 A1 May 18, 2017

(30) Foreign Application Priority Data

Nov. 13, 2015 (JP) ................... 2015-222564

(51) Int. Cl.
| | | |
|---|---|---|
| *H01L 41/04* | (2006.01) | |
| *H01L 41/09* | (2006.01) | |
| *H01L 41/083* | (2006.01) | |
| *B25J 9/12* | (2006.01) | |
| *H01L 41/047* | (2006.01) | |
| *H01L 41/187* | (2006.01) | |
| *H01L 41/273* | (2013.01) | |
| *H01L 41/29* | (2013.01) | |
| *B25J 15/02* | (2006.01) | |

(Continued)

(52) U.S. Cl.
CPC .............. *H01L 41/083* (2013.01); *B25J 9/12* (2013.01); *B25J 9/123* (2013.01); *B25J 15/0293* (2013.01); *F04B 43/095* (2013.01); *H01L 41/0471* (2013.01); *H01L 41/09* (2013.01); *H01L 41/0913* (2013.01); *H01L 41/1871* (2013.01); *H01L 41/273* (2013.01); *H01L 41/29* (2013.01); *H02N 2/004* (2013.01)

(58) Field of Classification Search
CPC ... H01L 41/083; H01L 41/0471; H01L 41/09; H01L 41/1871; H01L 41/273; H01L 41/29; H01L 41/047; H02N 2/004; B25J 9/12; B25J 9/123; B25J 15/0293; F04B 43/095
USPC ................ 310/311, 328, 340, 344
See application file for complete search history.

(56) References Cited

U.S. PATENT DOCUMENTS

| | | | | |
|---|---|---|---|---|
| 6,108,274 A | * | 8/2000 | Pearce | .................. B06B 1/0688 367/157 |
| 6,211,603 B1 | | 4/2001 | Iino et al. | |

(Continued)

FOREIGN PATENT DOCUMENTS

| | | | | |
|---|---|---|---|---|
| CN | 1722600 A | | 1/2006 | |
| FR | 2875300 A1 | * | 3/2016 | ............... G01L 9/08 |

(Continued)

OTHER PUBLICATIONS

Partial European Search Report for Application No. EP 16 19 8426 dated Apr. 21, 2017 with Provisional Opinion (15 pages).

(Continued)

*Primary Examiner* — Thomas M Dougherty
(74) *Attorney, Agent, or Firm* — Harness, Dickey & Pierce, P.L.C.

(57) ABSTRACT

A piezoelectric actuator includes two substrates, piezoelectric elements that are arranged between the two substrates, and a cladding portion that covers at least a part of a surrounding area of the piezoelectric elements.

16 Claims, 15 Drawing Sheets

(51) Int. Cl.
*F04B 43/09* (2006.01)
*H02N 2/00* (2006.01)

(56) References Cited

U.S. PATENT DOCUMENTS

| | | | |
|---|---|---|---|
| 2001/0011860 A1* | 8/2001 | Dettmann | H01L 41/0913 310/323.16 |
| 2003/0155845 A1* | 8/2003 | Uchiyama | H01L 41/314 310/367 |
| 2003/0223155 A1* | 12/2003 | Uchiyama | H01L 41/332 360/294.4 |
| 2004/0094815 A1* | 5/2004 | Park | B81B 3/0018 257/419 |
| 2004/0136117 A1* | 7/2004 | Kuwajima | G11B 5/5552 360/294.4 |
| 2004/0227432 A1 | 11/2004 | Takahashi | |
| 2006/0001331 A1 | 1/2006 | Nagahama | |
| 2008/0092838 A1* | 4/2008 | Takeuchi | H01T 13/18 123/169 R |
| 2012/0153774 A1 | 6/2012 | Maruyama | |
| 2013/0140954 A1 | 6/2013 | Kamijo et al. | |
| 2014/0293155 A1* | 10/2014 | Kim | H01L 41/113 349/12 |
| 2017/0141702 A1* | 5/2017 | Tsuyuki | B25J 9/12 |
| 2018/0160248 A1* | 6/2018 | Murakami | H04R 17/005 |

FOREIGN PATENT DOCUMENTS

| | | | | |
|---|---|---|---|---|
| JP | 2004-142438 A | 5/2004 | | |
| JP | 2006-033912 A | 2/2006 | | |
| JP | 2006-080318 A | 3/2006 | | |
| JP | 2006-340503 A | 12/2006 | | |
| JP | 2008-147219 A | 6/2008 | | |
| JP | 2008-218953 A | 9/2008 | | |
| JP | 2009-128351 A | 6/2009 | | |
| JP | 2012-135072 A | 7/2012 | | |
| JP | 2014-164266 A | 9/2014 | | |
| KR | 10-2008-0094252 A | * | 10/2008 | G02F 1/67 |
| WO | WO-2015159628 A1 | * | 10/2015 | G06F 3/02 |

OTHER PUBLICATIONS

Extended European Search Report for Application No. EP 16 19 8426 dated Jul. 24, 2017 (12 pages).

* cited by examiner

PIEZOELECTRIC ACTUATOR, STACKED ACTUATOR, PIEZOELECTRIC MOTOR, ROBOT, HAND, AND LIQUID TRANSPORT PUMP

BACKGROUND

1. Technical Field

The present invention relates to a piezoelectric actuator and various apparatuses that use the piezoelectric actuator.

2. Related Art

Known is a piezoelectric actuator in which piezoelectric bodies are bonded to both surfaces of a shim material and the surrounding area of the piezoelectric bodies is covered with resin (for example, JP-A-2006-80318).

The piezoelectric actuator of JP-A-2006-80318 may experience external damage since the piezoelectric bodies are on both surfaces (outside) of the shim material. External damage to the piezoelectric bodies may impair function of the piezoelectric bodies in a case where, particularly, the piezoelectric bodies are thin films.

SUMMARY

An advantage of some aspects of the invention is to solve at least a part of the problems described above, and the invention can be implemented as the following aspects.

(1) According to an aspect of the invention, a piezoelectric actuator is provided. The piezoelectric actuator includes two substrates, a piezoelectric element that is arranged between the two substrates, and a cladding portion that covers at least a part of the piezoelectric element. According to this aspect, the piezoelectric element is unlikely to experience external damage since being protected by the two substrates and the cladding portion.

(2) According to another aspect of the invention, a piezoelectric actuator is provided. The piezoelectric actuator includes two substrates that are arranged to at least partially overlie each other in a plan view, piezoelectric elements that are respectively arranged on facing surfaces of the two substrates in a region where the two substrates overlie each other in the plan view, and cladding portions that respectively cover at least parts of the two piezoelectric elements. According to this aspect, the piezoelectric elements are covered with the cladding portions and are respectively arranged on the facing surfaces of the two substrates that are arranged to at least partially overlie each other. Thus, the piezoelectric elements are protected by the two substrates as well and are unlikely to experience external damage.

(3) In the aspect, it is preferable that a bond layer is arranged between the two cladding portions. According to this aspect, since the bond layer is arranged between the two cladding portions, the two cladding portions are unlikely to be separated, and the piezoelectric elements are easily protected.

(4) In the aspect, it is preferable that the substrate includes a vibrating portion and a support portion that supports the vibrating portion and that the two piezoelectric elements are provided in the vibrating portion. According to this aspect, vibration of the support portion can be reduced, and the strength of the substrate can be increased.

(5) In the aspect, it is preferable that the cladding portion entirely covers the piezoelectric element. According to this aspect, the piezoelectric element is easily protected since the cladding portion entirely covers the piezoelectric element.

(6) In the aspect, it is preferable that the cladding portion covers at least a part of a surrounding area of the support portion. According to this aspect, the support portion is protected as well since the cladding portion covers at least a part of the surrounding area of the support portion.

(7) In the aspect, it is preferable that a protruding region is included at a tip end of the vibrating portion. According to this aspect, vibration of the vibrating portion can be transmitted to other members by using the protruding region.

(8) In the aspect, it is preferable that the piezoelectric actuator further includes a wiring layer that is arranged to connect the vibrating portion and the support portion, and a circuit substrate that is electrically connected to the wiring layer and is connected to the support portion. Vibration of the vibrating portion is unlikely to affect the circuit substrate since the circuit substrate is connected to the support portion.

(9) According to still another aspect of the invention, a stacked actuator is provided. The stacked actuator includes a plurality of the piezoelectric actuators in stack formation. According to this aspect, driving power of the stacked actuator can be increased.

The invention can be implemented in various aspects and, for example, can be implemented in various aspects in addition to the piezoelectric actuator and the stacked actuator, such as a piezoelectric motor that includes the piezoelectric actuator or the stacked actuator, and a robot, a hand, and a liquid transport pump that include the piezoelectric motor.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1A:
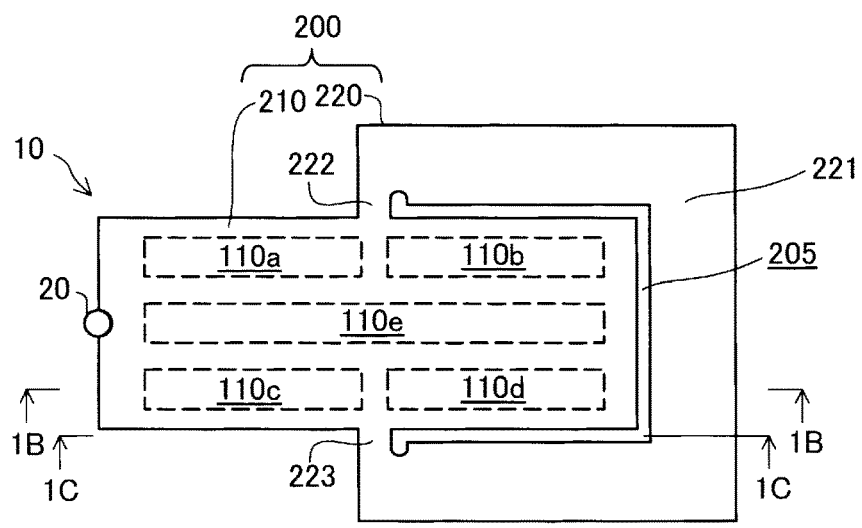
FIG. 1A is a plan view illustrating a schematic configuration of a piezoelectric actuator.

FIG. 1A is a plan view illustrating a schematic configuration of a piezoelectric actuator 10. The piezoelectric actuator 10 includes piezoelectric elements 110a, 110b, 110c, 110d, and 110e, a substrate 200, and a projection member 20. The substrate 200 includes a vibrating portion 210 and a support portion 220 that supports the vibrating portion 210. The vibrating portion 210 has an approximately rectangular shape in which the piezoelectric elements 110a, 110b, 110c, 110d, and 110e are arranged. The piezoelectric element 110e is configured to have an approximately rectangular shape and is configured to extend in the longitudinal direction of the vibrating portion 210 at the widthwise center of the vibrating portion 210. The piezoelectric elements 110a, 110b, 110c, and 110d are configured to be positioned at four corners of the vibrating portion 210. The support portion 220 is configured to surround approximately half of the vibrating portion 210, and end portions of the support portion 220 are connected to the vibrating portion 210 at the center of the long edge of the vibrating portion 210. The end portions of the support portion 220 connected to the vibrating portion 210 will be referred to as "first connected portion 222", and "second connected portion 223", and the part of the support portion 220 other than the first connected portion 222 and the second connected portion 223 will be referred to as "fixed portion 221". An interval 205 is configured between the vibrating portion 210 and the support portion 220. When a voltage is applied to the piezoelectric elements 110a to 110e, the piezoelectric elements 110a to 110e are expanded and contracted, and the vibrating portion 210 is vibrated. The interval 205 is configured to have a size in which the vibrating portion 210, even if vibrated, does not contact the fixed portion 221 of the support portion 220. The projection member 20 is arranged on a short edge on the side of the vibrating portion 210 not surrounded by the support portion 220. That is, a region that has a protruding shape is arranged at the tip end of the vibrating portion 210. The projection member 20 is preferably configured of a durable material such as ceramic (for example, $Al_2O_3$).

Figure 1B:
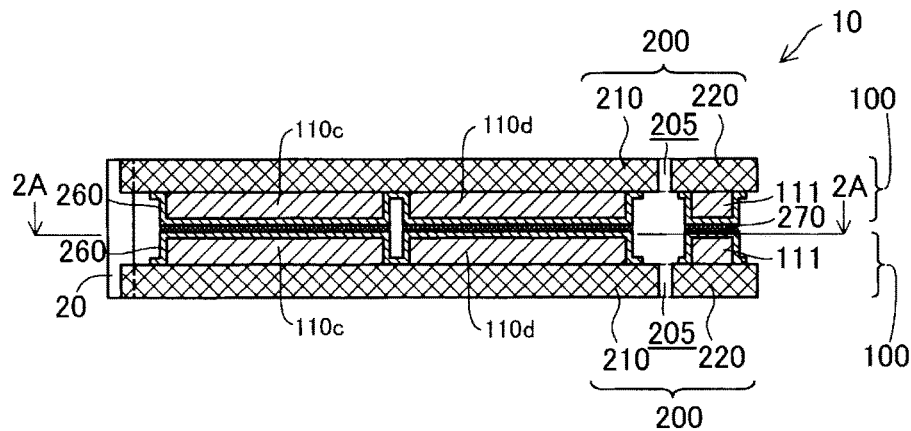
FIG. 1B is a sectional view of the piezoelectric actuator.

FIG. 1B is a sectional view of the piezoelectric actuator 10 taken along 1B-1B in FIG. 1A. The piezoelectric actuator 10 includes two piezoelectric actuator units 100. Each of the two piezoelectric actuator units 100 includes the substrate 200 and the five piezoelectric elements 110a to 110e arranged on the substrate 200. FIG. 1B illustrates two piezoelectric elements 110c and 110d and does not illustrate the other three piezoelectric elements 110a, 110b, and 110e. The piezoelectric elements 110a to 110e are arranged on each of the facing surfaces of two substrates 200 in a region (the region of the vibrating portion 210) where the two substrates 200 overlie each other in a plan view (FIG. 1A). Two piezoelectric elements that are designated by the same reference sign, for example, two piezoelectric elements 110a, are positioned to be seen in an overlying manner in the plan view of the two substrates 200. The same applies to the other piezoelectric elements 110b to 110e. The two piezoelectric actuator units 100 are arranged in such a manner that the piezoelectric elements 110a to 110e are sandwiched between the two substrates 200 with the substrates 200 positioned outside. The piezoelectric elements 110a to 110e are covered with a protective layer 260. The "protective layer 260" will be referred to as "cladding portion 260" as well. The cladding portions 260 of the two piezoelectric actuator units 100 are bonded by a bond layer 270, and thereby the piezoelectric actuator 10 is configured. The projection member 20, though the shape of the projection member 20 is not described along with FIG. 1A, has an approximately cylindrical shape and straddles the two substrates 200. The projection member 20 may have a spherical shape or an ellipsoidal shape and be provided on each substrate 200.

The piezoelectric actuator 10 as illustrated in FIG. 1B includes, on the support portion 220, a piezoelectric element structure 111 that has the same layer structure as the piezoelectric elements 110a to 110e. Two support portions 220 are arranged at an interval in a case where the piezoelectric actuator 10 does not include the piezoelectric element structure 111 on the support portion 220 of the substrate 200. The piezoelectric elements 110a to 110e are arranged between the two substrates 200 in the vibrating portion 210. The vibrating portion 210 and the support portion 220 have different thicknesses in a case where the piezoelectric element structure 111 is not included on the support portion 220. Thus, the piezoelectric actuator units 100 are not in contact in the support portion 220, and the structure may be unstable. When the piezoelectric element structure 111 is included on the support portion 220, the thicknesses of the vibrating portion 210 and the support portion 220 approximately match, and the piezoelectric actuator units 100 are in contact in the support portion 220. Thus, the structure is likely to be stable. The support portion 220 may be vibrated when the piezoelectric element structure 111 is expanded and contracted by a voltage applied thereto. Thus, the piezoelectric element structure 111 is preferably configured not to be expanded and contracted even if a voltage is applied thereto or in such a manner that a voltage is not applied to a piezoelectric body thereof. For example, two electrodes between which the piezoelectric body of the piezoelectric element structure 111 is sandwiched may be grounded or short-circuited.

Figure 1C:
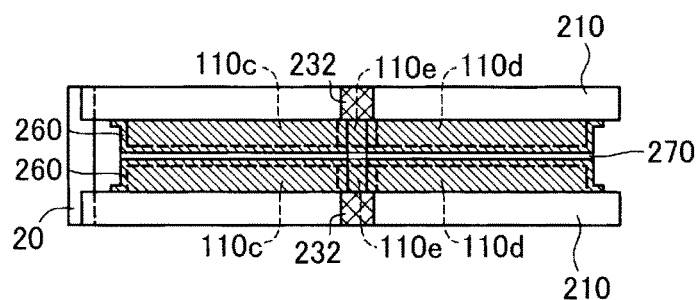
FIG. 1C is a side view of the piezoelectric actuator.

FIG. 1C is a side view of the piezoelectric actuator 10. For convenience of illustration, FIG. 1C illustrates the side view in the vibrating portion 210 and does not illustrate the side view in the support portion 220 (FIGS. 1A and 1B). As understood from FIG. 1C, the cladding portion 260 covers the side surfaces of the piezoelectric elements 110a to 110e as well.

Figure 2A:
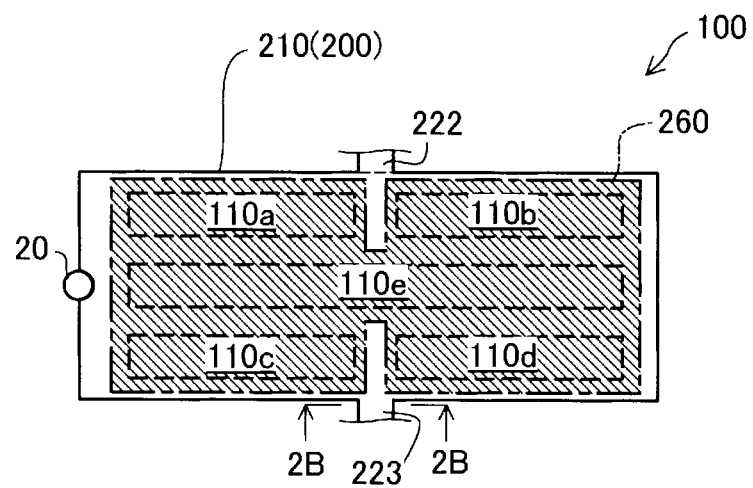
FIG. 2A is a top view of a piezoelectric actuator unit.

FIG. 2A is a top view of one piezoelectric actuator unit 100. FIG. 2A illustrates the vibrating portion 210 and does not illustrate the support portion 220 except for parts corresponding to the first connected portion 222 and the second connected portion 223. Each of the piezoelectric elements 110a to 110e of the piezoelectric actuator unit 100 is covered with the cladding portion 260. The cladding portion 260 does not exist in regions that are in contact with the first connected portion 222 and the second connected portion 223. The cladding portion 260 is said to cover at least a part of the surrounding area of the piezoelectric elements 110a to 110e. The cladding portion 260 may entirely cover the surrounding area of the piezoelectric elements 110a to 110e.

Figure 2B:
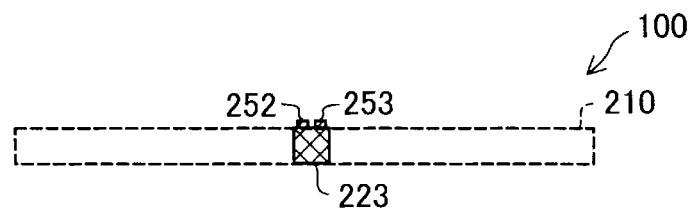
FIG. 2B is a sectional view of the piezoelectric actuator unit in a second connected portion.

FIG. 2B is a sectional view of one piezoelectric actuator unit 100 in the second connected portion 223. The vibrating portion 210 is illustrated by a broken line in FIG. 2B. The piezoelectric elements 110a to 110e and the cladding portion 260 on the vibrating portion 210 are not illustrated. Wirings 252 and 253 are seen on the second connected portion 223. However, the cladding portion 260 is not arranged on the second connected portion 223. Similarly, the cladding portion 260 is not arranged on the first connected portion 222 though not illustrated. The cladding portion 260 is not required to cover the entire piezoelectric elements 110a to 110e and may not cover a part of the surrounding area thereof (for example, parts corresponding to the wirings 252 and 253). The cladding portion 260 may entirely cover the surrounding area of the piezoelectric elements 110a to 110e.

Figure 3:
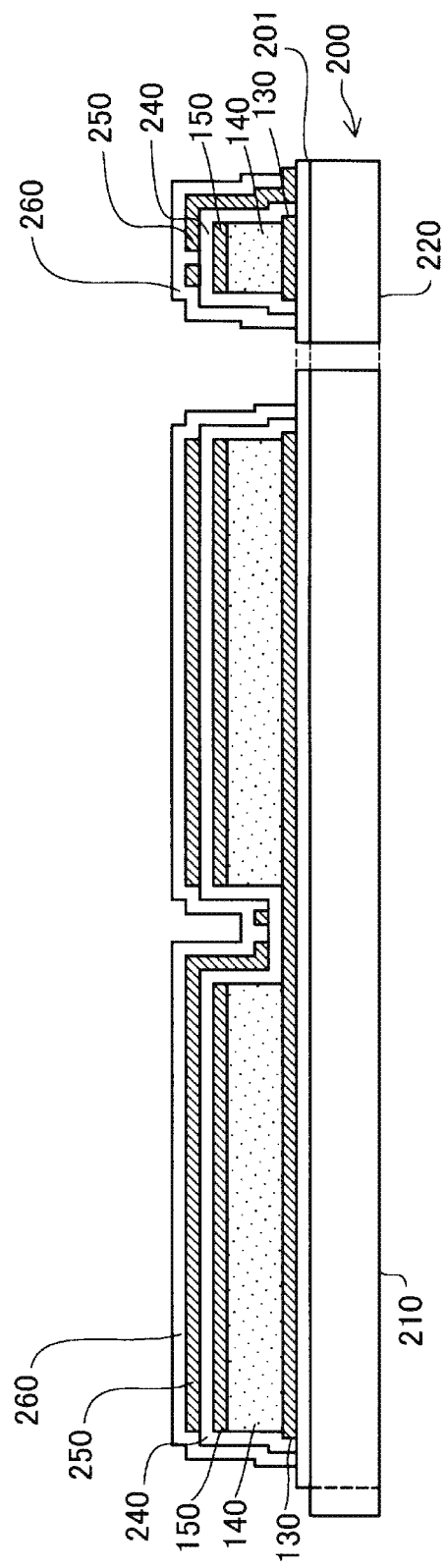
FIG. 3 is a descriptive diagram illustrating the piezoelectric actuator unit in an enlarged manner.

FIG. 3 is a descriptive diagram illustrating a section of the piezoelectric actuator unit 100 in detail. The piezoelectric actuator unit 100 is such that members including an insulating layer 201, a first electrode 130, a piezoelectric body 140, a second electrode 150, an insulating layer 240, a wiring layer 250, and the protective layer 260 (cladding portion 260) are arranged in this order on the substrate 200. The insulating layer 201 insulates the substrate 200 from other electrodes (the first electrode 130, the second electrode 150, and the wiring layer 250). The first electrode 130, the piezoelectric body 140, and the second electrode 150 constitute the piezoelectric elements 110a to 110e. The insulating layer 240 covers and insulates the piezoelectric elements 110a to 110e. The insulating layer 240 includes a contact hole that is used to cause the first electrodes 130 and the second electrodes 150 of the piezoelectric elements 110a to 110e to be in contact with the wiring layer 250. The wiring layer 250 constitutes a wiring that is used to conduct electricity to the first electrode 130 and the second electrode 150. The protective layer 260 (cladding portion 260) protects the piezoelectric elements 110a to 110e as described above.

Figure 4:
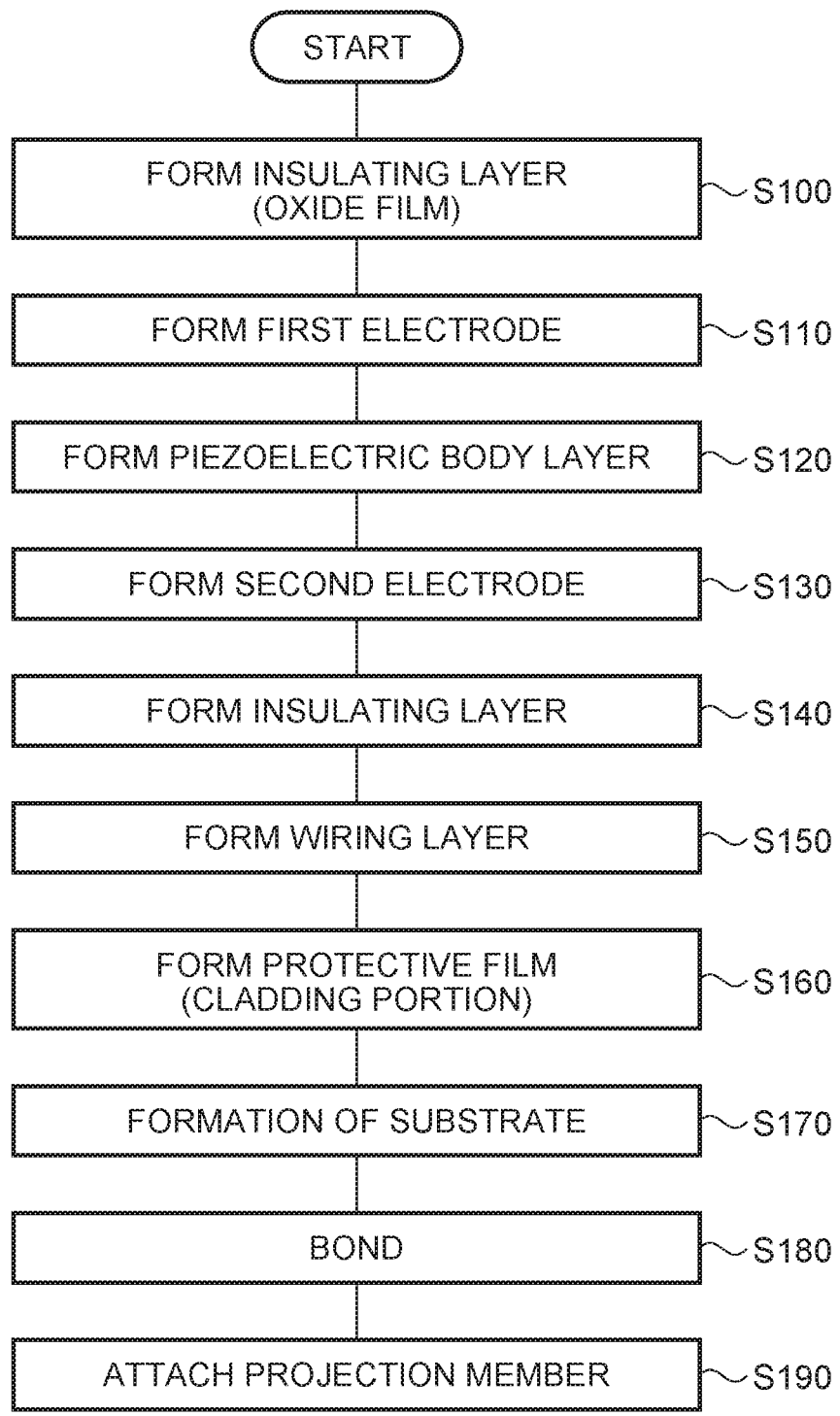
FIG. 4 is a flowchart illustrating manufacturing processes for the piezoelectric actuator.
Figure 5:
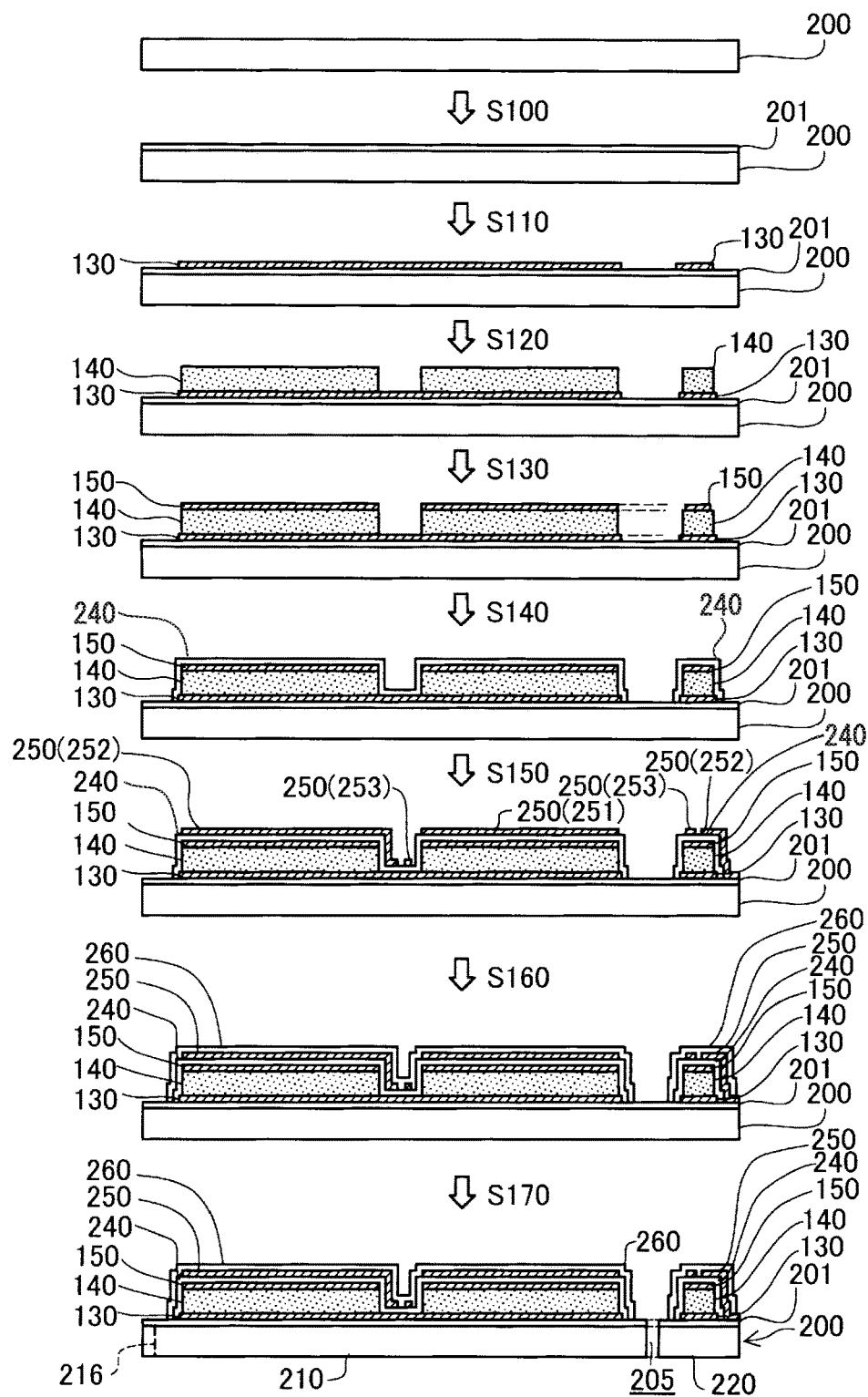
FIG. 5 is a descriptive diagram illustrating manufacturing processes for the piezoelectric actuator unit.

FIG. 4 is a flowchart illustrating manufacturing processes for the piezoelectric actuator. FIG. 5 is a descriptive diagram illustrating manufacturing processes for the piezoelectric actuator unit. In Step S100, the insulating layer 201 is formed on the substrate 200. An Si wafer, for example, can be used as the substrate 200. The piezoelectric actuator unit 100 may be formed in multiple quantities on one Si wafer. An $SiO_2$ layer, for example, that is formed by thermal oxidation of the surface of the substrate 200 can be used as the insulating layer 201. The insulating layer 201 is not illustrated in FIG. 1B and the like. An organic material such as alumina ($Al_2O_3$), acryl, and polyimide can be used as the insulating layer 201. The process of forming the insulating layer 201 may be omitted in a case where the substrate 200 is an insulating body.

In Step S110, the first electrode 130 is formed and is patterned. Any material having high conductivity, such as aluminum (Al), nickel (Ni), gold (Au), platinum (Pt), iridium (Ir), and copper (Cu), may be used as the material of the first electrode 130. The first electrode 130 can be formed by, for example, sputtering and can be patterned by, for example, etching.

In Step S120, the piezoelectric body 140 is formed on the first electrode 130 and is patterned. Any material exhibiting a piezoelectric effect, such as ceramic that adopts the $ABO_3$ perovskite structure, may be used as the material of the piezoelectric body 140. For example, lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, and lead scandium niobate may be used as the ceramic that adopts the $ABO_3$ perovskite structure. Materials other than ceramic that exhibit a piezoelectric effect, such as polyvinylidene fluoride and quartz crystal, may be used as well.

The piezoelectric body 140 may be formed by using, for example, the sol-gel method. That is, a sol-gel solution as a piezoelectric body material is dripped onto the substrate 200 (first electrode 130), and the substrate 200 is rotated at a high speed to form a thin film of the sol-gel solution on the first electrode 130. Then, calcination is performed at a temperature of 200° C. to 300° C. to form a first layer of the piezoelectric body material on the first electrode 130. Then, the cycle of sol-gel solution dripping, high-speed rotation, and calcination is repeated multiple times to form a piezoelectric body layer to a desired thickness on the first electrode 130. The thickness of one layer of the piezoelectric body formed in one cycle, though depending on the viscosity of the sol-gel solution and the speed of rotation of the substrate 200, is a thickness of approximately 50 nm to 150 nm. After the piezoelectric body layer is formed to a desired thickness, sintering is performed at a temperature of 600° C. to 1,000° C. to form the piezoelectric body 140. If the thickness of the piezoelectric body 140 after sintering is greater than or equal to 50 nm (0.05 μm) and less than or equal to 20 μm, the piezoelectric actuator 10 can be implemented to have a small size. If the thickness of the piezoelectric body 140 is greater than or equal to 0.05 μm, sufficiently large force can be generated in response to expansion and contraction of the piezoelectric body 140. If the thickness of the piezoelectric body 140 is less than or equal to 20 μm, sufficiently large force can be generated even if the voltage applied to the piezoelectric body 140 is less than or equal to 600 V. As a result, a drive circuit (not illustrated) that is used to drive the piezoelectric actuator 10 can be configured of inexpensive elements. The thickness of the piezoelectric body may be greater than or equal to 400 nm. In this case, large force can be generated by the piezoelectric elements. The temperatures and the times of calcination and sintering are examples and are appropriately chosen according to the piezoelectric body material.

Performing sintering after a thin film of the piezoelectric body material is formed with the use of the sol-gel method has advantages over a related art sintering method that mixes powder of raw materials and performs sintering, in that (a) the thin film is easily formed, (b) crystallization is easily performed with aligned lattice directions, and (c) the breakdown voltage of the piezoelectric body can be improved.

Patterning of the piezoelectric body 140 in the first embodiment is performed in Step S120 by ion milling that uses an argon ion beam. Instead of patterning using ion milling, patterning may be performed by any other patterning methods (for example, dry etching that uses chlorine-based gas).

In Step S130, the second electrode 150 is formed on the piezoelectric body 140 and is patterned. Forming and patterning of the second electrode 150 can be performed by etching in the same manner as the first electrode 130.

In Step S140, the insulating layer 240 is formed on the second electrode 150 and is patterned to form a contact hole. In Step S150, the wiring layer 250 is formed on the insulating layer 240 by using copper or brass, and the wiring layer 250 is patterned to form wirings.

Figure 6:
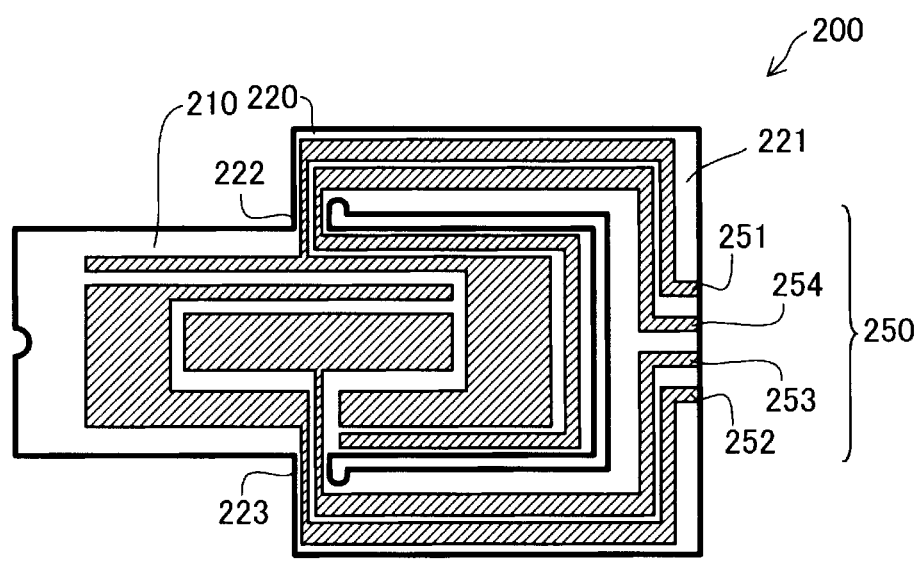
FIG. 6 is a descriptive diagram illustrating a wiring pattern provided by a wiring electrode.

FIG. 6 is a descriptive diagram illustrating a wiring pattern provided by the wiring layer 250. The wiring layer 250 includes four wirings 251, 252, 253, and 254. The wirings 251 to 254 are formed to reach the vibrating portion 210 through the connected portion 222 or 223 from the fixed portion 221. That is, the wirings 251 to 254 are arranged to connect the vibrating portion 210 and the support portion 220. The first wiring 251 is connected to the second electrodes 150 of the piezoelectric elements 110a and 110d (FIGS. 1A to 1C) in the vibrating portion 210. Similarly, the second wiring 252 is connected to the second electrodes 150 of the piezoelectric elements 110b and 110c in the vibrating portion 210. The third wiring 253 is connected to the second electrode 150 of the piezoelectric element 110e in the vibrating portion 210. The fourth wiring 254 is connected to the first electrodes 130 of the piezoelectric elements 110a, 110b, 110c, 110d, and 110e in the vibrating portion 210. The wirings 251 to 254 are connected to a circuit substrate in the support portion 220. The wirings 251 to 254 are not connected to the piezoelectric element structure 111 of the fixed portion 221.

In Step S160, the protective layer 260 (cladding portion 260) is formed. The cladding portion 260 is formed of silicone resin such as junction coating resin (JCR). Instead of JCR, resin materials such as epoxy and polyimide may be used to form the cladding portion 260.

In Step S170, etching is performed to form the interval 205 between the vibrating portion 210 and the support portion 220 and to form a recess portion 216 that is used to attach the projection member 20, along with forming the shapes of the individual substrates 200.

Figure 7:
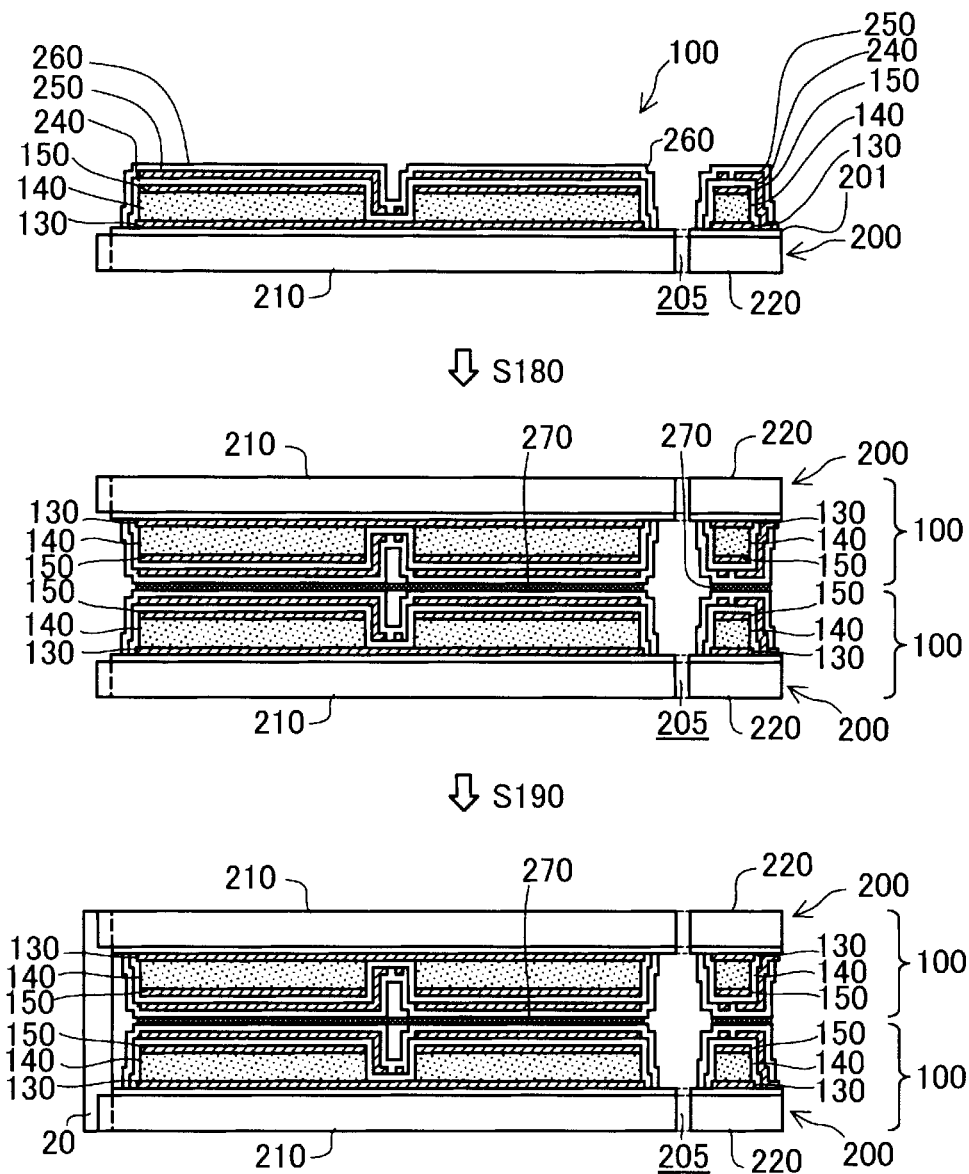
FIG. 7 is a descriptive diagram illustrating processes of manufacturing the piezoelectric actuator using two piezoelectric actuator units.

FIG. 7 is a descriptive diagram illustrating processes of manufacturing the piezoelectric actuator 10 using the two piezoelectric actuator units 100. In Step S180, the two piezoelectric actuator units 100 are arranged in such a manner that members designated by the same reference sign are in plane symmetry with the substrates 200 positioned outside and the piezoelectric elements 110a to 110e directed inward. Then, the cladding portions 260 of the two piezoelectric actuator units 100 are bonded by using the bond layer 270. The piezoelectric elements 110a to 110e are covered with the cladding portion 260 and are sandwiched between the two substrates 200 and thus are unlikely to experience external damage caused by dust. In Step S190, the projection member 20 is bonded to the recess portion 216 by adhesive.

Figure 8:
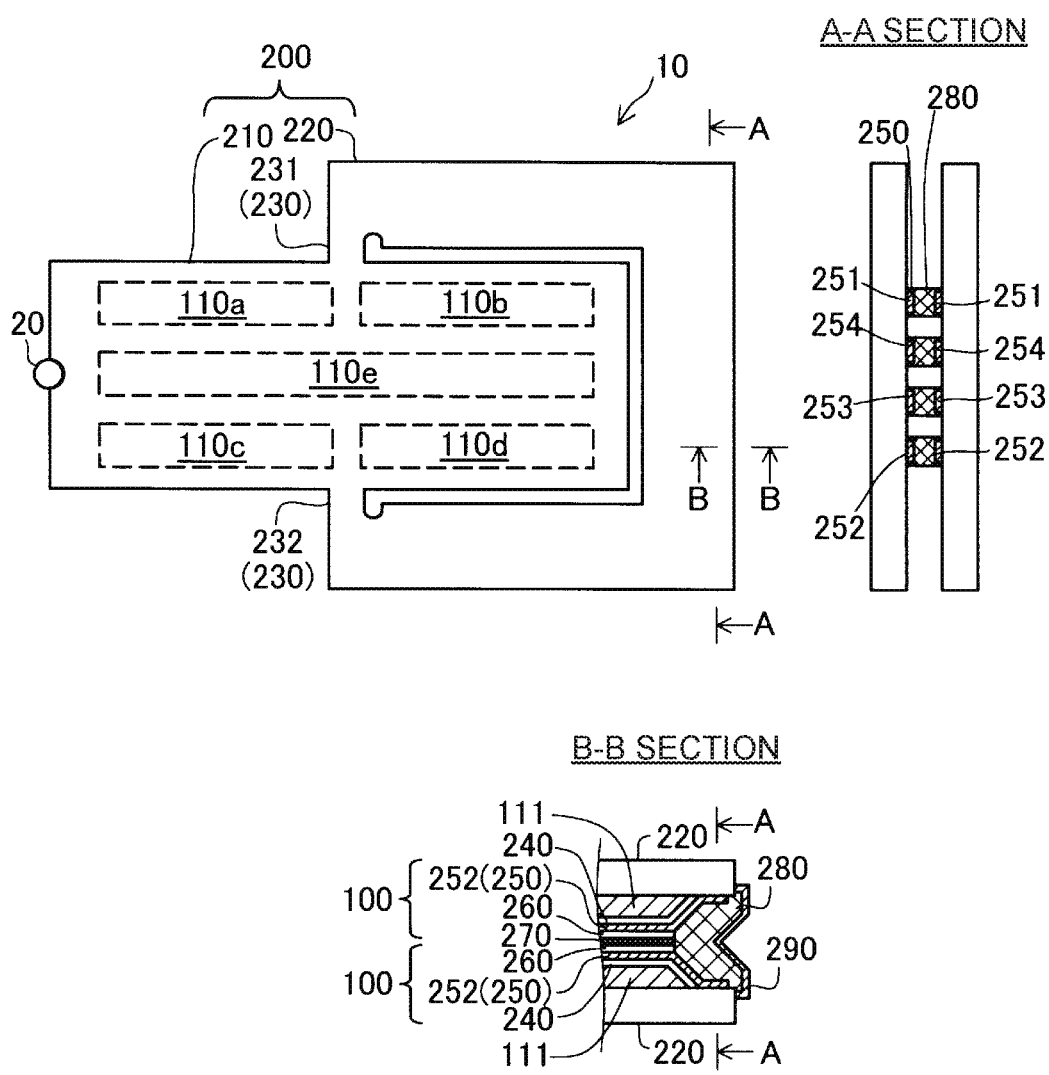
FIG. 8 is a descriptive diagram of a connected portion between the piezoelectric actuator and a circuit substrate.

FIG. 8 is a descriptive diagram of a connected portion between the piezoelectric actuator 10 and a circuit substrate (not illustrated). The piezoelectric actuator 10 is connected to an external circuit substrate in the support portion 220. An insulating layer (the insulating layer 201 in FIG. 3; not illustrated in FIG. 8) is formed on the support portion 220 (substrate 200). The piezoelectric element structure 111, the insulating layer 240, the wiring 252 (the second wiring 252 of the wirings 251 to 254 of the wiring layer 250 is seen in the section taken along B-B in FIG. 8) and the protective layer 260 (cladding portion 260) are formed in order on the insulating layer in the support portion 220. The external shape of the piezoelectric actuator unit 100 when seen from the direction of stacking, though not described along with the processes illustrated in FIG. 5, has a size decreased toward the upper layer since patterning is performed by using etching or ion milling. The second wiring 252 is formed from the top of the piezoelectric element structure 111 to a position in which the piezoelectric element structure 111 is not formed in the support portion 220. An electroless nickel plating layer 280 is formed between two second wirings 252. A gold plating layer 290 is formed on the electroless nickel plating layer 280.

Figure 9:
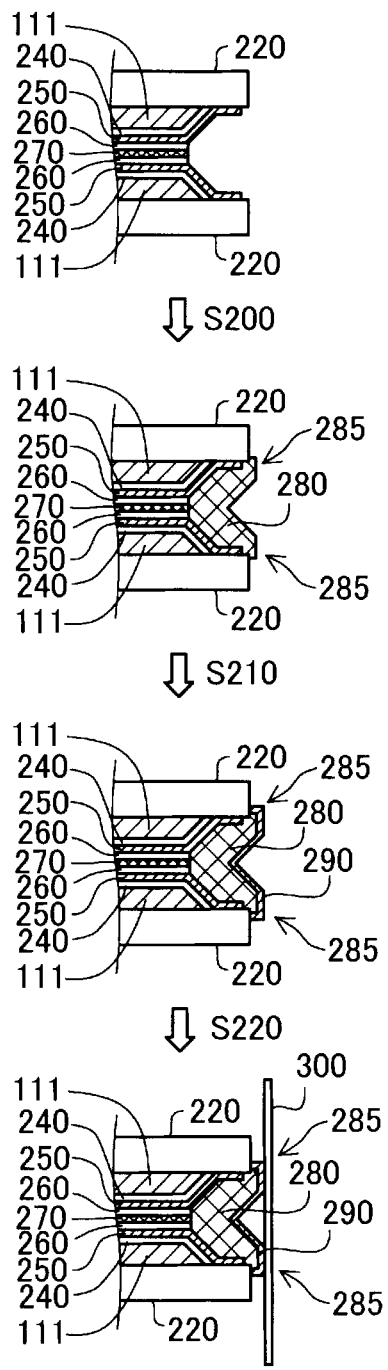
FIG. 9 is a descriptive diagram illustrating processes of connecting the piezoelectric actuator and a substrate.

FIG. 9 is a descriptive diagram illustrating processes of connecting the piezoelectric actuator and the circuit substrate. While the second wiring 252 will be illustratively described, the same applies to the other wirings 251, 253, and 254. In Step S200, the electroless nickel plating layer 280 is formed on the second wiring 252. In forming the electroless nickel plating layer 280, first, an end portion of the piezoelectric actuator 10 is immersed in a catalyst solution that includes palladium ions. Since the second wiring 252 is formed of copper or brass, a part of copper is replaced by palladium, and palladium metal is adsorbed to the second wiring 252.

Next, the end portion of the piezoelectric actuator 10 is immersed in an electroless nickel-phosphorus plating liquid. The electroless nickel-phosphorus plating liquid includes nickel ions ($Ni^{2+}$) and hypophosphite ions ($H_2PO_2^-$). Nickel ions ($Ni^{2+}$) and hypophosphite ions ($H_2PO_2^-$) cause an oxidation-reduction reaction described below with palladium as a catalyst, and reduced nickel is precipitated on the second wiring 252. Since nickel is precipitated along the second wiring 252, the nickel has a shape including a projection portion 285 that protrudes to the outer edge side from the substrate 200 along the substrate 200 (support portion 220). The nickel may include phosphorus when precipitated.

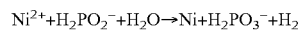

In Step S210, the gold plating layer 290 is formed on the electroless nickel plating layer 280. In Step S220, the piezoelectric actuator 10 is bonded to a circuit substrate 300. The circuit substrate 300 has a structure in which wirings are formed on a flexible substrate. The projection portion 285 is intruded into the circuit substrate 300 by pressing the projection portion 285 including the gold plating layer 290 to the circuit substrate 300, and thereby the piezoelectric actuator 10 and the circuit substrate 300 are bonded and electrically connected.

Figure 10:
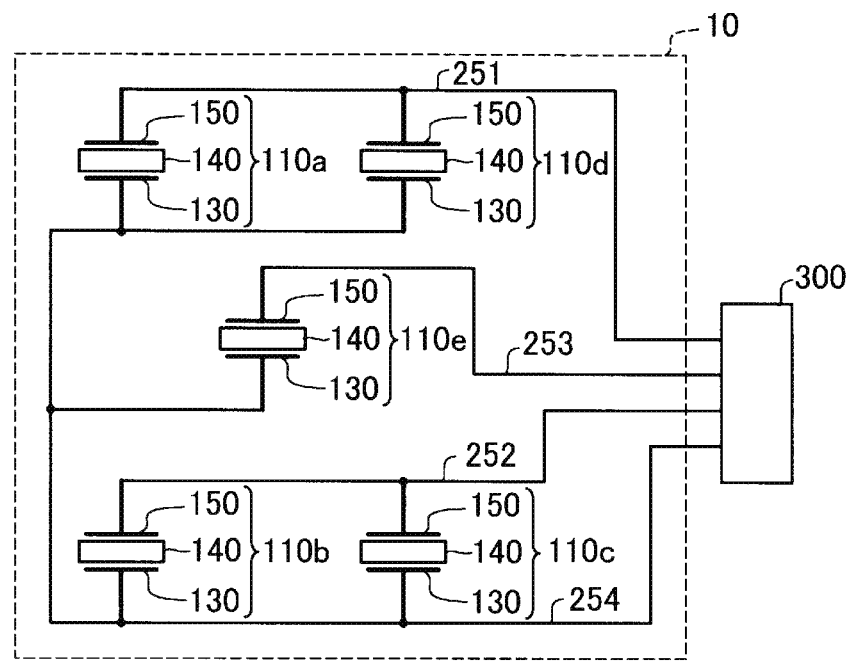
FIG. 10 is a descriptive diagram illustrating an equivalent circuit of the piezoelectric actuator.

FIG. 10 is a descriptive diagram illustrating an equivalent circuit of the piezoelectric actuator 10. While the piezoelectric actuator 10 includes two piezoelectric actuator units 100, FIG. 10 illustrates only one piezoelectric actuator unit 100. As understood from FIG. 10, the first electrodes 130 of the five piezoelectric elements 110a to 110e are connected to the wiring 254 and are connected to the circuit substrate 300. The second electrodes 150 of the piezoelectric elements 110a and 110d are connected to the wiring 251 and are connected to the circuit substrate 300. The second electrodes 150 of the piezoelectric elements 110b and 110c are connected to the wiring 252 and are connected to the circuit substrate 300. The second electrode 150 of the piezoelectric element 110e is connected to the wiring 253 and is connected to the circuit substrate 300. That is, the piezoelectric elements 110a to 110e are divided into three groups. A first group includes two piezoelectric elements 110a and 110d. A second group includes two piezoelectric elements 110b and 110c. A third group includes only one piezoelectric element 110e. The piezoelectric elements 110a and 110d of the first group are connected in parallel with each other and are connected to the circuit substrate 300. The piezoelectric elements 110b and 110c of the second group are connected in parallel with each other and are connected to the circuit substrate 300. Large voltages can be applied to each of the piezoelectric elements 110a to 110d when parallel connection is made. The piezoelectric element 110e of the third group is connected to the circuit substrate 300 alone. The piezoelectric elements 110a and 110d of the first group may be connected in series. In this case, the directions of polarization of the piezoelectric elements 110a and 110d when voltages are applied are preferably the same. The piezoelectric elements 110b and 110c of the second group may be connected in series as well. Capacitance can be decreased when serial connection is made.

Applying a periodically changing alternating current voltage or an undulating voltage from the circuit substrate 300 between the first electrode 130 and the second electrode 150 of a predetermined piezoelectric element, for example, the piezoelectric elements 110a and 110d of the first group, of the five piezoelectric elements 110a to 110e causes the piezoelectric actuator 10 to be subjected to ultrasonic vibration and allows a rotor (a driven body; a driven member) that is in contact with the projection member 20 to be rotated in a predetermined direction of rotation. The "undulating voltage" means a voltage obtained by adding a DC offset to an alternating current voltage. The voltage (electric field) of the undulating voltage is unidirectional from one electrode to another electrode. The direction of a current is preferably a direction from the second electrode 150 to the first electrode 130 rather than a direction from the first electrode 130 to the second electrode 150. Applying an alternating current voltage or an undulating voltage between the first electrode 130 and the second electrode 150 of the piezoelectric elements 110b and 110c of the second group allows the rotor which is in contact with the projection member 20 to be rotated in the opposite direction. That is, the piezoelectric actuator 10 functions as a piezoelectric motor.

Figure 11:
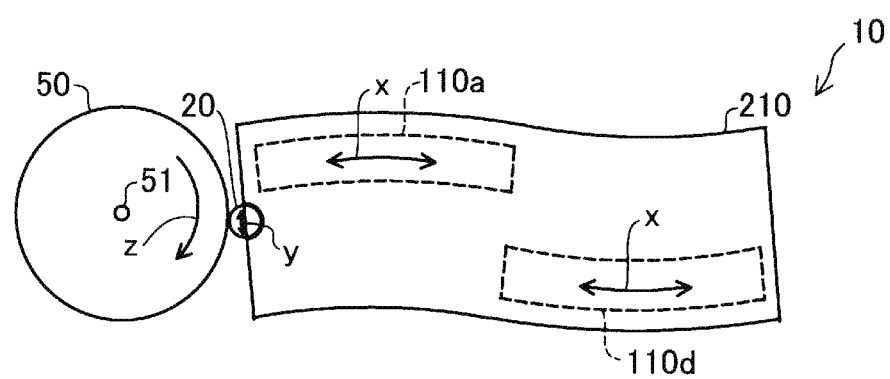
FIG. 11 is a descriptive diagram illustrating an example of operation of the piezoelectric actuator.

FIG. 11 is a descriptive diagram illustrating an example of operation of the piezoelectric actuator 10. The support portion 220 is not illustrated for convenience of illustration. The projection member 20 of the piezoelectric actuator 10 is in contact with the circumference of a rotor 50 that is a driven member. An alternating current voltage or an undulating voltage is applied to the two piezoelectric elements 110a and 110d of the first group in the example illustrated in FIG. 11, and the piezoelectric elements 110a and 110d are expanded and contracted in the direction of an arrow x in FIG. 11. In response thereto, the vibrating portion 210 of the piezoelectric actuator 10 is bent in the plane of the vibrating portion 210 and is deformed into a meander shape (S shape), and the tip end of the projection member 20 reciprocates in the direction of an arrow y or moves elliptically. As a result, the rotor 50 rotates in a predetermined direction z (a clockwise direction in FIG. 11) around a center 51 thereof. The rotor 50 rotates in the opposite direction in a case where the circuit substrate 300 applies an alternating current voltage or an undulating voltage to the two piezoelectric elements 110b and 110c (FIG. 10) of the second group. If an alternating current voltage or an undulating voltage is applied to the piezoelectric element 110e at the center, the piezoelectric actuator 10 is expanded and contracted in the longitudinal direction. Thus, larger force may be exerted on the rotor 50 from the projection member 20. Such operation of the piezoelectric actuator 10 is disclosed in JP-A-2004-320979 (or corresponding U.S. Pat. No. 7,224,102), the content of disclosure of which is incorporated herein by reference.

According to the first embodiment described heretofore, the piezoelectric actuator 10 includes the piezoelectric elements 110a to 110e that are arranged between two substrates 200, and the cladding portion 260 that covers at least a part of the surrounding area of the piezoelectric elements 110a to 110e. As a result, the piezoelectric elements 110a to 110e are unlikely to experience external damage since being protected by the two substrates 200 and the cladding portion 260.

According to the first embodiment, the piezoelectric actuator 10 includes two substrates 200 that are arranged to at least partially overlie each other in a plan view, the piezoelectric elements 110a to 110e that are arranged on each of the facing surfaces of the two substrates 200 in the region where the two substrates 200 overlie each other in a plan view (the region of the vibrating portion 210), and the cladding portion 260 that covers the piezoelectric elements 110a to 110e in each piezoelectric actuator unit 100. According to this embodiment, the piezoelectric elements 110a to 110e are covered with the cladding portion 260 and are arranged on each of the facing surfaces of two substrates 200 that are arranged to at least partially overlie each other. Thus, the piezoelectric elements 110a to 110e are protected by the two substrates 200 as well and are unlikely to experience external damage.

According to the first embodiment, the cladding portions 260 that cover the piezoelectric elements 110a to 110e of each piezoelectric actuator unit 100 are bonded to each other by the bond layer 270. Thus, the two cladding portions 260 are unlikely to be separated, and the piezoelectric elements 110a to 110e are easily protected.

According to the first embodiment, the substrate 200 includes the vibrating portion 210 and the support portion 220, and the piezoelectric elements 110a to 110e are provided in the vibrating portion 210. Thus, vibration of the support portion 220 can be reduced, and the strength of the substrate 200 can be increased.

While the cladding portion 260 does not cover the piezoelectric elements 110a to 110e in the connected portions 222 and 223 between the vibrating portion 210 and the support portion 220 in the above embodiment, the cladding portion 260 may cover the entire piezoelectric elements 110a to 110e. If the cladding portion 260 covers the entire piezoelectric elements 110a to 110e, the piezoelectric elements 110a to 110e are more easily protected.

The above embodiment may adopt a configuration in which the cladding portion 260 covers at least a part of the surrounding area of the support portion 220. If the cladding portion 260 covers at least a part of the surrounding area of the support portion 220, the support portion 220 can be protected.

Second Embodiment

Figure 12:
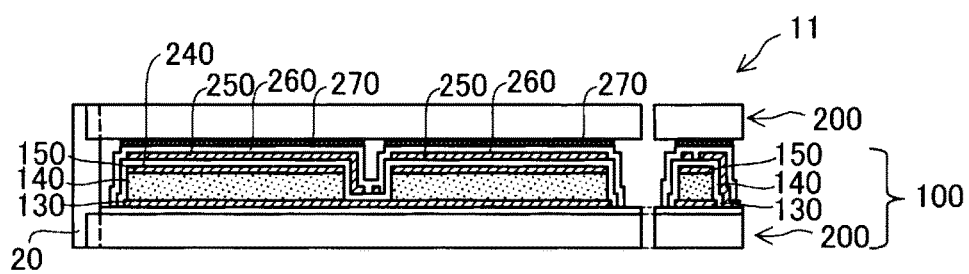
FIG. 12 is a descriptive diagram illustrating a piezoelectric actuator of a second embodiment.

FIG. 12 is a descriptive diagram illustrating a piezoelectric actuator 11 of a second embodiment. While the piezoelectric actuator 10 of the first embodiment includes two piezoelectric actuator units 100, the piezoelectric actuator 11 of the second embodiment includes only one piezoelectric actuator unit 100 and, instead of the second piezoelectric actuator unit 100 of the first embodiment, includes the substrate 200 on which piezoelectric elements are not arranged. That is, the piezoelectric elements 110a to 110e of the first piezoelectric actuator unit 100 are sandwiched between the substrate 200 of the first piezoelectric actuator unit 100 and the substrate 200 on which piezoelectric elements are not arranged.

The piezoelectric actuator 11 of the second embodiment includes two substrates 200, the piezoelectric elements 110a to 110e that are arranged between the two substrates 200, and the cladding portion 260 that covers at least a part of the surrounding area of the piezoelectric elements. According to the piezoelectric actuator 11 of the second embodiment, the effect that the piezoelectric elements 110a to 110e are protected by the two substrates 200 and the cladding portion 260 is high. Thus, the piezoelectric elements 110a to 110e are unlikely to experience external damage in the same manner as the piezoelectric actuator 10 of the first embodiment.

Third Embodiment

Figure 13:
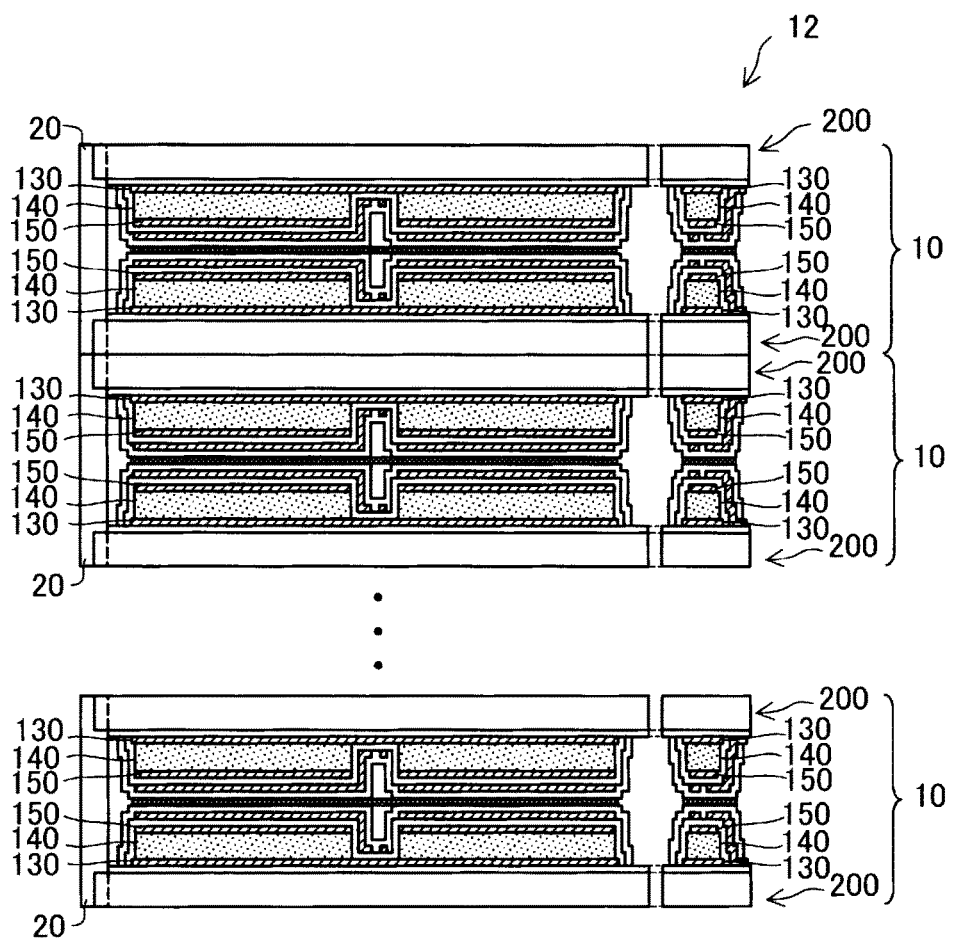
FIG. 13 is a descriptive diagram illustrating a stacked actuator of a third embodiment.

FIG. 13 is a descriptive diagram illustrating a stacked actuator 12 of a third embodiment. The piezoelectric actuator 10 is described in the first embodiment. The piezoelectric actuator 10 may be used in multiple quantities and be stacked in the direction normal to the surface of the substrate 200 to configure the stacked actuator 12. The piezoelectric actuator 11 of the second embodiment as well may be used in multiple quantities and be stacked in the direction normal to the surface of the substrate 200.

Other Embodiments

The piezoelectric actuator 10 described above can exert large force on the driven member using resonance and is applicable to various apparatuses. The piezoelectric actuator 10 can be used as a drive device in various apparatuses such as a robot (includes an electronic component transport apparatus (IC handler) as well), a pump for medication administration, a calendar advancing apparatus for a timepiece, and a printing apparatus (for example, a paper feeding mechanism; the piezoelectric actuator 10 is not applicable to a head since a piezoelectric actuator used in the head does not cause a vibrating plate to resonate.). Hereinafter, representative embodiments will be described.

Figure 14:
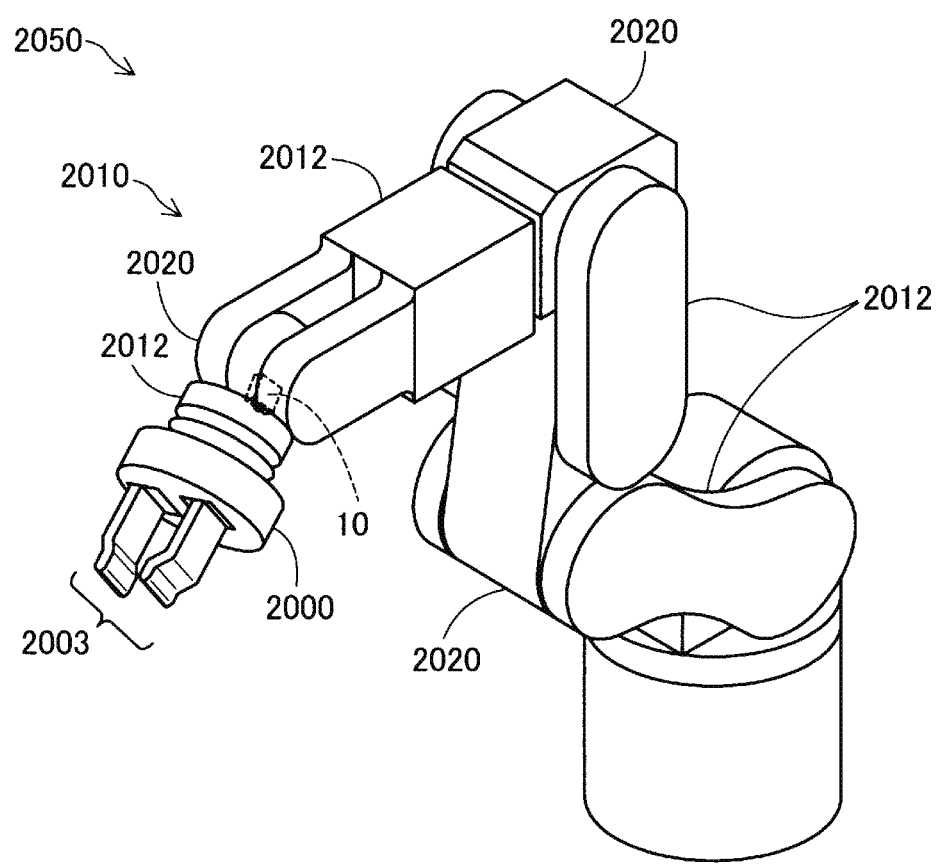
FIG. 14 is a descriptive diagram illustrating one example of a robot that uses a piezoelectric actuator (piezoelectric motor).

FIG. 14 is a descriptive diagram illustrating one example of a robot 2050 that uses the piezoelectric actuator 10 described above. The robot 2050 includes an arm 2010 (referred to as "arm unit" as well) that includes multiple link units 2012 (referred to as "link members" as well) and multiple joint units 2020 that provide pivotable or bendable connection between the link units 2012. The piezoelectric actuator 10 described above is incorporated in each joint unit 2020. The joint units 2020 may be pivoted or bent any angle by using the piezoelectric actuator 10. A hand 2000 is connected to the tip end of the arm 2010. The hand 2000 includes a pair of clasping units 2003. The piezoelectric actuator 10 is incorporated in the hand 2000 as well. An object may be clasped by opening and closing the clasping units 2003 using the piezoelectric actuator 10. The piezoelectric actuator 10 is provided between the hand 2000 and the arm 2010 as well. The hand 2000 may be rotated with respect to the arm 2010 by using the piezoelectric actuator 10.

Figure 15:
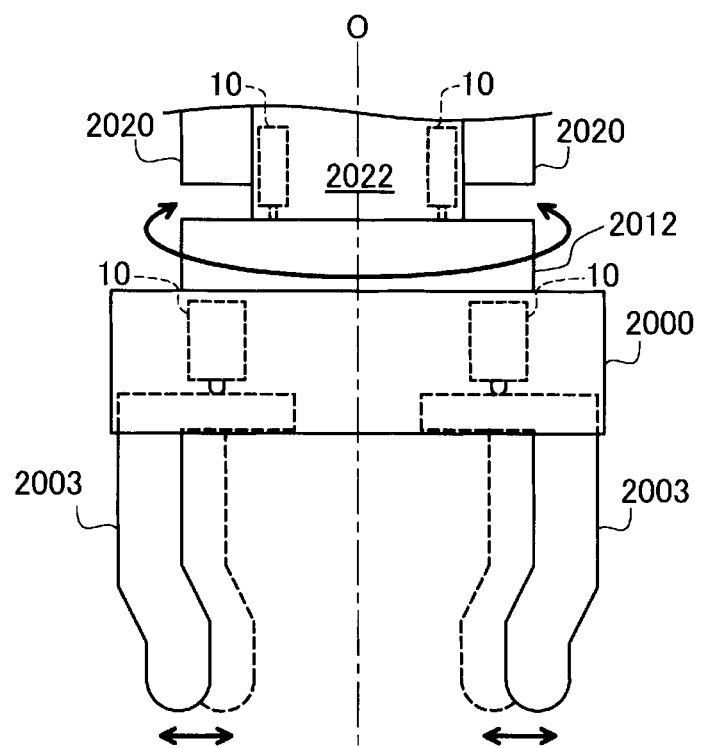
FIG. 15 is a descriptive diagram illustrating a hand that uses a piezoelectric actuator (piezoelectric motor).

FIG. 15 is a descriptive diagram of a wrist part of the robot 2050 illustrated in FIG. 14. The joint units 2020 of the wrist pinch a wrist pivoting unit 2022, and the link unit 2012 of the wrist is attached to the wrist pivoting unit 2022 in a pivotable manner around a central axis O of the wrist pivoting unit 2022. The wrist pivoting unit 2022 includes the piezoelectric actuator 10, and the piezoelectric actuator 10 pivots the link portion 2012 of the wrist and the hand 2000 around the central axis O. Multiple clasping units 2003 are erected on the hand 2000. A base portion of the clasping unit 2003 is movable in the hand 2000. The piezoelectric actuator 10 is mounted in a root part of the clasping unit 2003. Thus, the clasping unit 2003 can be moved by operating the piezoelectric actuator 10 to clasp a target object.

The robot is not limited to a single-arm robot. The piezoelectric actuator 10 is also applicable to a multi-arm robot that includes two or more arms. Power lines that supply power to various devices such as a force sensor and a gyrosensor, signal lines that transmit signals, and the like are included in the joint units 2020 of the wrist and in the hand 2000 in addition to the piezoelectric actuator 10, and a significantly large number of wirings are required. Therefore, it is significantly difficult to arrange wirings in the joint units 2020 and the hand 2000. However, a drive current of the piezoelectric actuator 10 of the embodiment described above can be rendered smaller than that of a typical electric motor or a piezoelectric drive device of the related art. Thus, wirings may be arranged in a small space such as the joint units 2020 (particularly, the joint units at the tip end of the arm 2010) and the hand 2000.

While the robot 2050 that includes the hand 2000 is illustratively described above, the hand 2000 may be configured as not only a component of the robot 2050 but also a single product.

Figure 16:
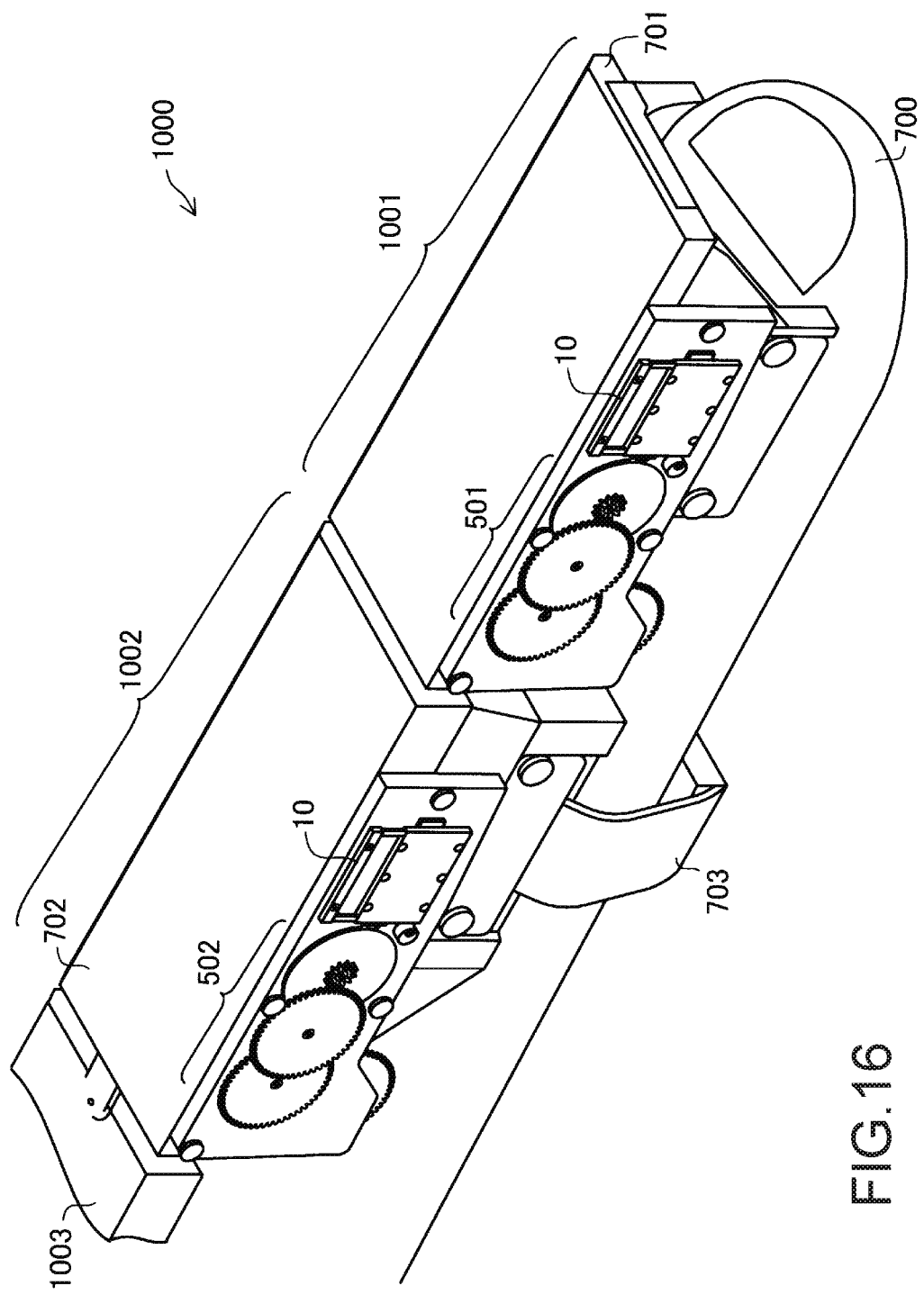
FIG. 16 is a descriptive diagram illustrating a finger assist apparatus that uses a piezoelectric actuator.

FIG. 16 is a descriptive diagram illustrating a finger assist apparatus 1000 that uses the piezoelectric actuator 10 described above. The finger assist apparatus 1000 includes a first finger assist unit 1001, a second finger assist unit 1002, and a base member 1003 and is mounted on a finger 700. The first finger assist unit 1001 includes the piezoelectric actuator 10, a speed reducer 501, and a finger support portion 701. The second finger assist unit 1002 includes the piezoelectric actuator 10, a speed reducer 502, a finger support portion 702, and a band 703. The first finger assist unit 1001 has approximately the same configuration as the second finger assist unit 1002 except for the band 703. The band 703 fixes the second finger assist unit 1002 from the belly side of the finger 700. The band 703 is provided in the first finger assist unit 1001 as well, though not illustrated in FIG. 16. The finger assist apparatus 1000 assists bending and stretching of the finger 700 using the piezoelectric actuator 10. While the finger assist apparatus 1000 is described as assisting bending and stretching of the finger 700 in the present embodiment, a hand of a robot may be used instead of the finger 700, and the finger assist apparatus 1000 may be integrated with the hand. In this case, the hand is driven to be bent and stretched by the piezoelectric actuator 10.

Figure 17:
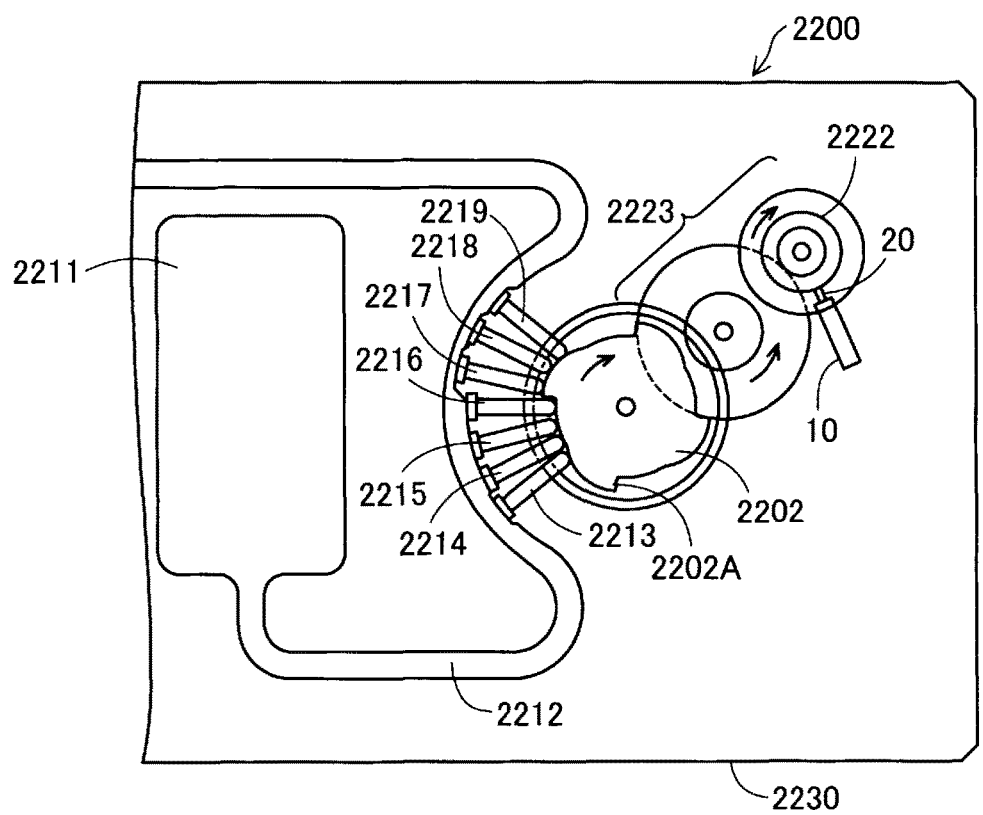
FIG. 17 is a descriptive diagram illustrating one example of a liquid transport pump that uses a piezoelectric actuator (piezoelectric motor).

FIG. 17 is a descriptive diagram illustrating one example of a liquid transport pump 2200 that uses the piezoelectric actuator 10 described above. A reservoir 2211, a tube 2212, the piezoelectric actuator 10, a rotor 2222, a speed reducing transmission mechanism 2223, a cam 2202, and multiple fingers 2213, 2214, 2215, 2216, 2217, 2218, and 2219 are provided in a case 2230 of the liquid transport pump 2200. The reservoir 2211 is an accommodation unit that is used to accommodate transport target liquid. The tube 2212 is a tube that is used to transport liquid carried out of the reservoir 2211. The projection member 20 of the piezoelectric actuator 10 is provided in a pressed state to aside surface of the rotor 2222, and the piezoelectric actuator 10 rotationally drives the rotor 2222. The force of rotation of the rotor 2222 is transmitted to the cam 2202 through the speed reducing transmission mechanism 2223. The fingers 2213 to 2219 are members that are used to occlude the tube 2212. When the cam 2202 rotates, a protrusion portion 2202A of the cam 2202 presses the fingers 2213 to 2219 in order in an outwardly radial direction. The fingers 2213 to 2219 occlude the tube 2212 in order from the upstream side (reservoir 2211 side) in the direction of transport. Accordingly, liquid in the tube 2212 is transported in order to the downstream side. This allows implementation of the liquid transport pump 2200 that may accurately transport a minute amount of liquid and has a small size. The arrangement of each member is not limited to the illustration. A configuration that does not include members such as fingers and occludes the tube 2212 with a ball and the like provided in the rotor 2222 may be used as well. The liquid transport pump 2200 described above can be used in, for example, a medication administering apparatus that administers liquid medication such as insulin to a human body. Since the drive current is rendered smaller than that of the piezoelectric drive device of the related art by using the piezoelectric actuator 10 of the embodiments described above, power consumption of the medication administering apparatus can be reduced. Therefore, the liquid transport pump 2200 is particularly effective in a case where the medication administering apparatus is battery driven.

While embodiments of the invention are described heretofore on the basis of several examples, the embodiments of the invention described above are intended for better understanding of the invention and do not limit the invention. It is apparent that the invention may be modified or improved to the extent not departing from the gist and the claims thereof and includes equivalents thereof.

The entire disclosure of Japanese Patent Application No. 2015-222564, filed Nov. 13, 2015 is expressly incorporated by reference herein.

What is claimed is:

1. A piezoelectric actuator comprising:
two substrates that are arranged to at least partially overlap each other in a plan view;
two piezoelectric elements that are respectively arranged on facing surfaces of the two substrates in a region where the two substrates overlap each other in the plan view; and
cladding members that respectively cover at least parts of the two piezoelectric elements,
wherein each of the two substrates includes a vibrating member and a support that supports the vibrating member, and
the two piezoelectric elements are provided in the vibrating members, respectively.

2. The piezoelectric actuator according to claim 1, wherein a bond layer is arranged between two of the cladding members.

3. The piezoelectric actuator according to claim 1, wherein each of the cladding members entirely covers each of the two piezoelectric elements.

4. The piezoelectric actuator according to claim 1, wherein each of the cladding members covers at least a part of a surrounding area of each of the supports.

5. The piezoelectric actuator according to claim 1, wherein a protrusion is included at a tip end of the vibrating members.

6. The piezoelectric actuator according to claim 1, further comprising:
a wiring layer that is arranged to connect each of the vibrating members and each of the supports; and
a circuit substrate that is electrically connected to the wiring layer and is connected to each of the supports.

7. A stacked actuator comprising:
the piezoelectric actuator according to claim 1 is configured with a plurality of the piezoelectric actuators that are stacked each other.

8. A stacked actuator comprising:
the piezoelectric actuator according to claim 2 is configured with a plurality of the piezoelectric actuators that are stacked each other.

9. A piezoelectric motor comprising:
the piezoelectric actuator according to claim 1; and
a driven member abutting the piezoelectric actuator,
wherein the driven member is driven by the piezoelectric actuator.

10. A piezoelectric motor comprising:
the stacked actuator according to claim 7; and
a driven member abutting the stacked actuator,
wherein the driven member is driven by the slacked actuator.

11. A robot comprising:
the piezoelectric motor according to claim 9; and
a link member connecting two movable members,
wherein the driven member is the link member.

12. A robot comprising:
the piezoelectric motor according to claim 10; and
a link member connecting two movable members,
wherein the driven member is the link member.

13. A hand comprising:
the piezoelectric motor according to claim 9; and
a clasping member configured to clasp an object,
wherein the driven member is the clasping member.

14. A hand comprising:
the piezoelectric motor according to claim 10; and
a clasping member configured to clasp an object,
wherein the driven member is the clasping member.

15. A liquid transport pump comprising:
the piezoelectric motor according to claim 9;
a reservoir in which a liquid is stored;
a liquid flow path connected to the reservoir; and
a mechanism abutting the liquid flow path,
wherein the driven member moves the mechanism so as to transport the liquid from the reservoir via the liquid flow path.

16. A liquid transport pump comprising:
the piezoelectric motor according to claim 10;
a reservoir in which a liquid is stored;
a house flow path connected to the reservoir; and
a mechanism abutting the liquid flow path,
wherein the driven member moves the mechanism so as to transport the liquid from the reservoir via the house flow path.

* * * * *